United States Patent
Sato

(10) Patent No.: US 8,040,741 B2
(45) Date of Patent: Oct. 18, 2011

(54) SEMICONDUCTOR INTEGRATED CIRCUIT

(75) Inventor: Jumpei Sato, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 335 days.

(21) Appl. No.: 12/349,686

(22) Filed: Jan. 7, 2009

(65) Prior Publication Data
US 2009/0174465 A1    Jul. 9, 2009

(30) Foreign Application Priority Data
Jan. 8, 2008 (JP) .................... 2008-001429

(51) Int. Cl.
*G11C 5/14* (2006.01)
(52) U.S. Cl. .................................. 365/189.09
(58) Field of Classification Search .............. 365/189.09
See application file for complete search history.

(56) References Cited

U.S. PATENT DOCUMENTS

| | | | |
|---|---|---|---|
| 5,301,097 A * | 4/1994 | McDaniel | 363/60 |
| 5,641,986 A | 6/1997 | Uchida | |
| 6,921,960 B2 | 7/2005 | Ichige et al. | |
| 2002/0070402 A1 * | 6/2002 | Ichige et al. | 257/296 |
| 2003/0151449 A1 | 8/2003 | Nakagawa et al. | |
| 2004/0185617 A1 * | 9/2004 | Shukuri | 438/257 |
| 2008/0068916 A1 * | 3/2008 | Sako | 365/226 |
| 2009/0303797 A1 | 12/2009 | Sugimae et al. | |

FOREIGN PATENT DOCUMENTS

JP    3173327    3/2001

* cited by examiner

*Primary Examiner* — Hoai V Ho
*Assistant Examiner* — Anthan Tran
(74) *Attorney, Agent, or Firm* — Oblon, Spivak, McClelland, Maier & Neustadt, L.L.P.

(57) ABSTRACT

A semiconductor integrated circuit includes a boost circuit configured to boost a power supply voltage so as to generate first and second voltages, the second voltage being lower than the first voltage, a load circuit supplied with the first voltage, and a capacitor. The capacitor has first and second diffusion regions, a first insulating film formed on a channel region, a first electrode formed on the first insulating film, a second insulating film formed on the first electrode, and a second electrode formed on the second insulating film. The second voltage is applied to the first electrode. The first voltage is applied to the second electrode. The power supply voltage is applied to at least one of the first and second diffusion regions.

10 Claims, 5 Drawing Sheets

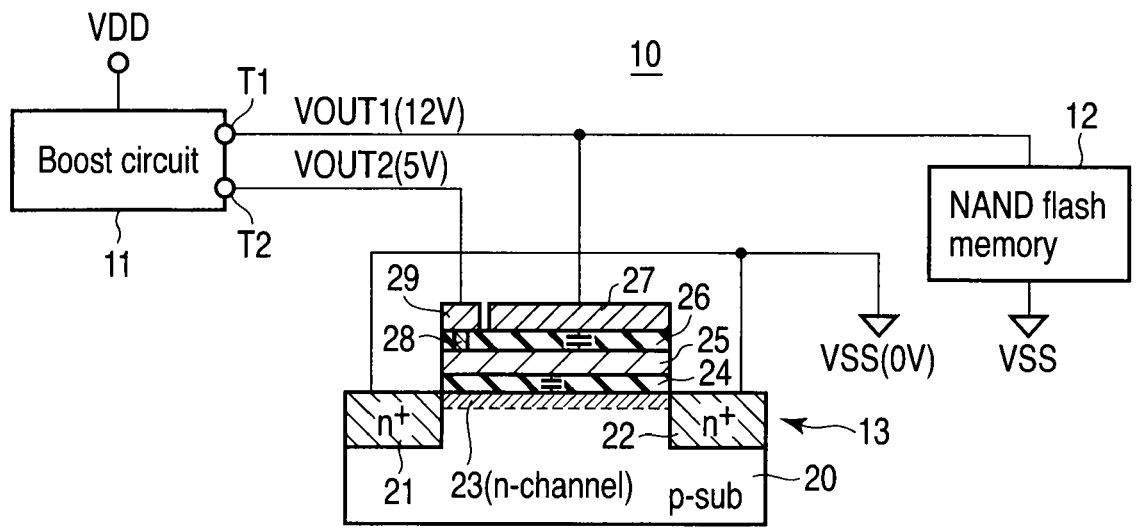
F I G. 1
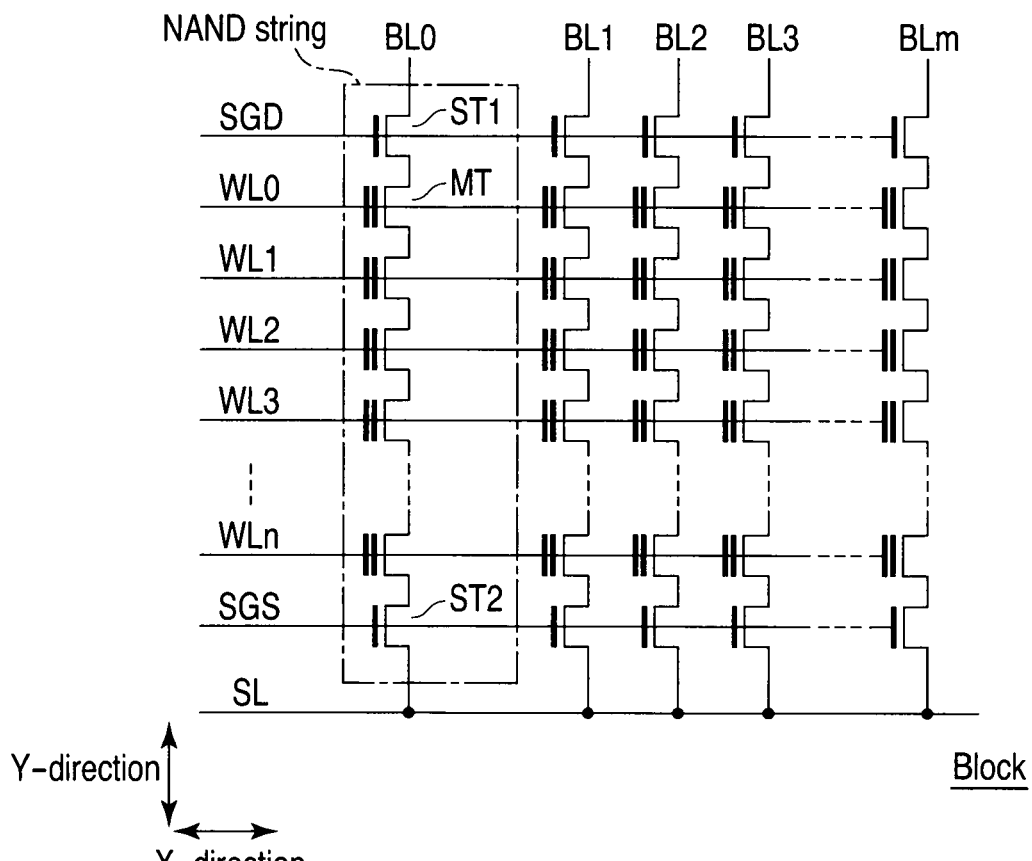
F I G. 2

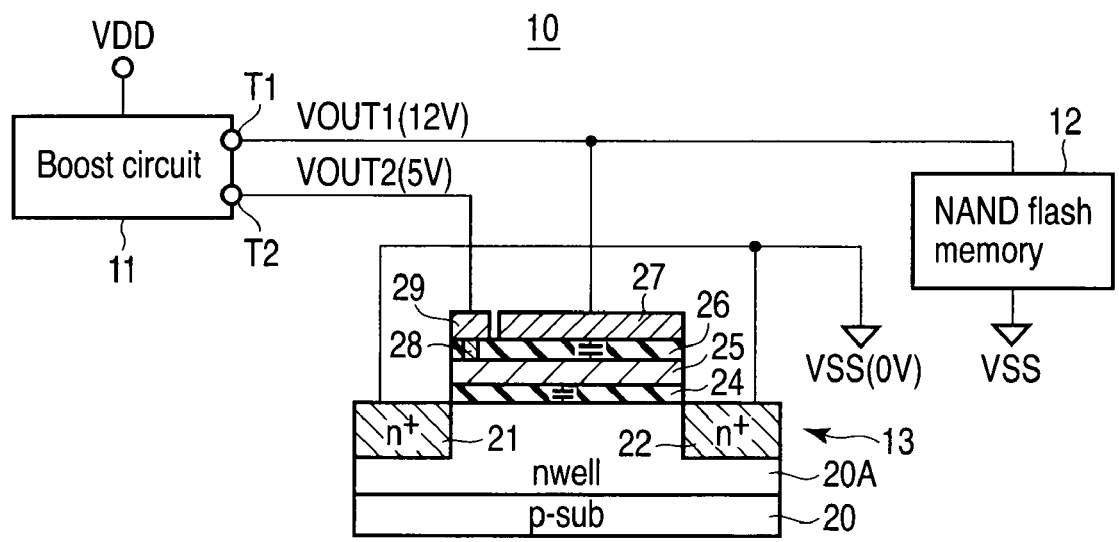
F I G. 8
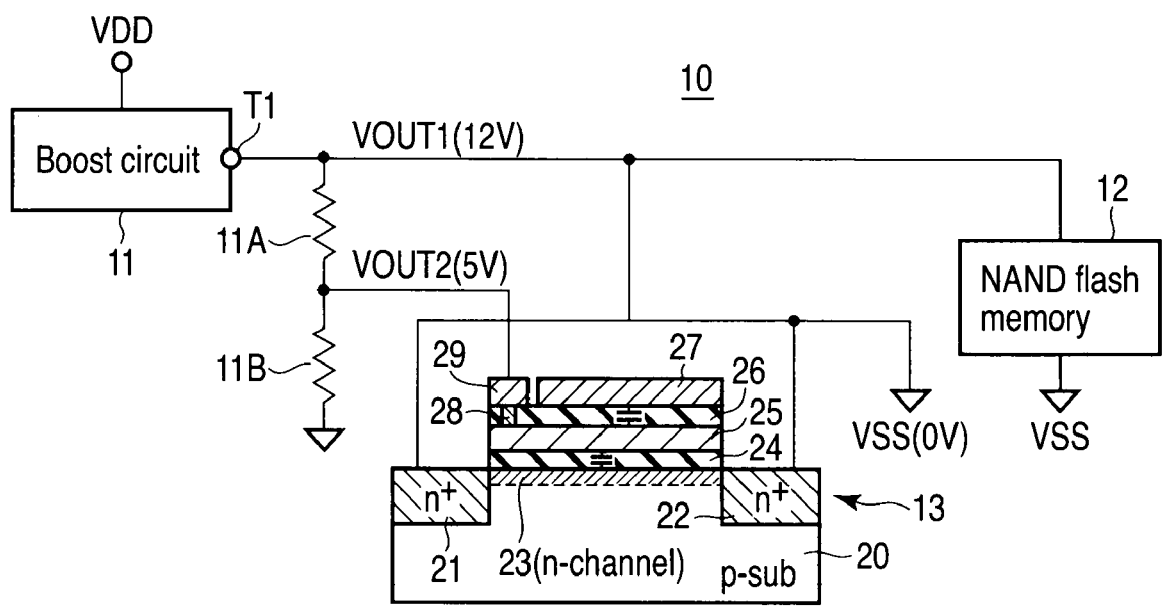
F I G. 9

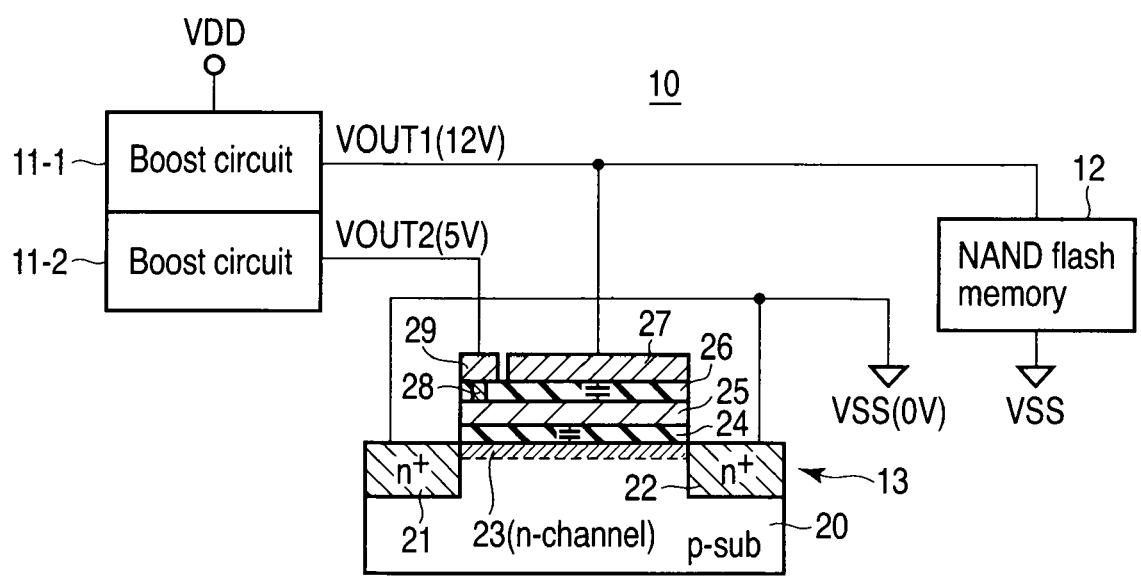
F I G. 10

SEMICONDUCTOR INTEGRATED CIRCUIT

CROSS-REFERENCE TO RELATED APPLICATIONS

This application is based upon and claims the benefit of priority from prior Japanese Patent Application No. 2008-001429, filed Jan. 8, 2008, the entire contents of which are incorporated herein by reference.

BACKGROUND OF THE INVENTION

1. Field of the Invention

The present invention relates to a semiconductor integrated circuit. In particular, the present invention relates to a semiconductor integrated circuit including a boost circuit for boosting a power supply voltage.

2. Description of the Related Art

A semiconductor integrated circuit has a built-in nonvolatile memory such as NAND flash memory capable of electrically achieving write and erase. In the semiconductor integrated circuit, an internal voltage generation circuit built in a chip generates the following various voltages with a single power supply. One is a high voltage required for write and erase operations. Another is a channel boost voltage for preventing a write error to a non-select memory cell. Another is a read voltage applied to a non-select memory cell in a read operation.

For example, the internal voltage generation circuit is composed of a boost circuit, a potential detection circuit, a clock generation circuit and a stabilization capacitor. Specifically, the boost circuit boosts a power supply voltage supplied externally. The potential detection circuit controls an output voltage of the boost circuit to a desired voltage (internal voltage). The clock generation circuit controls the operation of the boost circuit. The stabilization capacitor stores a boosted charge. The stabilization capacitor achieves a function as an instantaneous charge supply source for the following advantages. Namely, the ripple of the output of the boost circuit is prevented in a steady-state operation. In addition, when a large load is connected to an output terminal of the boost circuit, the output terminal is assisted so that the terminal does not fall below a certain voltage.

A NAND flash memory requires a high write voltage; for this reason, it has a built-in transistor having a high breakdown voltage insulating film thicker than a tunnel insulating film of a memory cell. The foregoing transistor having the thick insulating film is usable as a capacitor element. However, the insulating film is thick; for this reason, the capacitance per unit area is small. If a capacitor having a large capacitance is formed in a semiconductor integrated circuit, this is a factor of increasing a chip area.

The following technique has been disclosed as this kind of related art (see Japanese Patent No. 3173327). According to the foregoing technique, even if defect exists in a dielectric layer between electrodes having a boost voltage stabilization capacitance, the boost voltage stabilization capacitance is prevented from being destroyed.

BRIEF SUMMARY OF THE INVENTION

According to an aspect of the present invention, there is provided a semiconductor integrated circuit comprising: a boost circuit configured to boost a power supply voltage so as to generate first and second voltages, the second voltage being lower than the first voltage; a load circuit supplied with the first voltage; and a capacitor having: first and second diffusion regions formed in a state of separating from each other in a semiconductor substrate; a first insulating film formed on a channel region between the first and second diffusion regions; a first electrode formed on the first insulating film; a second insulating film formed on the first electrode; and a second electrode formed on the second insulating film, and comprising a transistor, the second voltage being applied to the first electrode, the first voltage being applied to the second electrode, the power supply voltage being applied to at least one of the first and second diffusion regions.

According to an aspect of the present invention, there is provided a semiconductor integrated circuit comprising: a boost circuit configured to boost a power supply voltage so as to generate first and second voltages, the second voltage being lower than the first voltage; a load circuit supplied with the first voltage; and a capacitor having: first and second diffusion regions formed in a state of separating from each other in a semiconductor substrate; a first insulating film formed on a channel region between the first and second diffusion regions; a first electrode formed on the first insulating film; a second insulating film formed on the first electrode; and a second electrode formed on the second insulating film, and comprising a transistor, the second voltage being applied to the first electrode, the power supply voltage being applied to the second electrode, the first voltage being applied to at least one of the first and second diffusion regions.

According to an aspect of the present invention, there is provided a semiconductor integrated circuit comprising: a boost circuit configured to boost a power supply voltage so as to generate first and second voltages, the second voltage being lower than the first voltage; a load circuit supplied with the first voltage; and a capacitor having: first and second diffusion regions formed in a state of separating from each other in a semiconductor region; a first insulating film formed on a channel region between the first and second diffusion regions; a first electrode formed on the first insulating film; a second insulating film formed on the first electrode; and a second electrode formed on the second insulating film, and comprising a transistor, the semiconductor region, the first and second diffusion regions being the same conductivity type, the second voltage being applied to the first electrode, the first voltage being applied to the second electrode, the power supply voltage being applied to at least one of the first and second diffusion regions.

According to an aspect of the present invention, there is provided a semiconductor integrated circuit comprising: a boost circuit configured to boost a power supply voltage so as to generate first and second voltages, the second voltage being lower than the first voltage; a load circuit supplied with the first voltage; and a capacitor having: first and second diffusion regions formed in a state of separating from each other in a semiconductor region; a first insulating film formed on a channel region between the first and second diffusion regions; a first electrode formed on the first insulating film; a second insulating film formed on the first electrode; and a second electrode formed on the second insulating film, and comprising a transistor, the semiconductor region, the first and second diffusion regions being the same conductivity type, the second voltage being applied to the first electrode, the power supply voltage being applied to the second electrode, the first voltage being applied to at least one of the first and second diffusion regions.

BRIEF DESCRIPTION OF THE SEVERAL VIEWS OF THE DRAWING

FIG. 1 is a view showing the configuration of a semiconductor integrated circuit 10 according to a first embodiment of the present invention;

FIG. 2 is a circuit diagram showing the configuration of one block included in a NAND flash memory 12;

FIG. 8 is a view showing the configuration of a semiconductor integrated circuit 10 according to a third embodiment of the present invention;

FIG. 9 is a view showing the configuration of a semiconductor integrated circuit 10 according to a fourth embodiment of the present invention; and FIG. 10 is a view showing the configuration of a semiconductor integrated circuit 10 according to a fifth embodiment of the present invention.

DETAILED DESCRIPTION OF THE INVENTION

Figure 3:
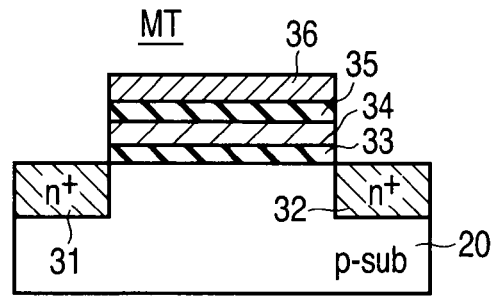
FIG. 3 is a cross-sectional view showing the structure of a memory cell transistor MT.

Various embodiments of the present invention will be hereinafter described with reference to the accompanying drawings. In the following description, the same number is used to designate component having the same function and configuration, and the overlapping explanation will be made if necessary.

First Embodiment

FIG. 1 is a view showing the configuration of a semiconductor integrated circuit 10 according to a first embodiment of the present invention. The semiconductor integrated circuit 10 includes a boost circuit 11, a load circuit 12 and a stabilization capacitor 13. The foregoing circuits and element are mounted on the same substrate. The semiconductor integrated circuit 10 is supplied externally with power supply voltage VDD (e.g., 3 V) and ground voltage VSS (0 V).

The boost circuit 11 boosts power supply voltage VDD to generate output voltages VOUT1 and VOUT2 higher than power supply voltage VDD. VOUT1 and VOUT 2 are output from output terminals T1 and T2 of the boost circuit 11, respectively. The magnitude of output voltage VOUT1 is changed in accordance with the configuration of the load circuit 12, and set to a voltage required for the load circuit 12. The load circuit 12 is supplied with voltage VOUT1 and ground voltage VSS (0 V).

The load circuit 12 is composed of a flash memory, which is given as one of nonvolatile semiconductor memories and is electrically rewritable. The kind of flash memory is not specially limited, and thus, any of NAND, NOR, AND and DINOR (divided bit-line NOR) flash memories may be used. According to this embodiment, a NAND flash memory 12 is given as one example of the load circuit. The NAND flash memory 12 is a memory, which executes data erase at a block unit. FIG. 2 is a circuit diagram showing the configuration of one block included in a NAND flash memory 12.

A block includes (m+1) NAND strings arrayed along the X-direction (m is a natural number more than 0). Each NAND string includes select transistors ST1, ST2 and (n+1) memory cell transistors MT (n is a natural number more than 0). Select transistors ST1 included in (m+1) NAND strings have drains connected to bit lines BL0 to BLm, respectively, and gates connected in common to a select gate line SGD. Select transistors ST2 has sources connected in common to a source line SL, and gates connected in common to a select gate line SGS.

In each NAND string, (n+1) memory cell transistors MT are arrayed between the source of select transistor ST1 and the drain of select transistor ST2 so that their current path is connected in series. In other words, a plurality of memory cell transistors is serial-connected in the Y-direction so that neighboring memory cell transistors share a diffusion region (source region or drain region).

Control gate electrodes are successively connected to word lines WL0 to WLn from the memory cell transistor MT positioned at the most drain side. Therefore, the drain of the memory cell transistor MT connected to the word line WL0 is connected to the source of select transistor ST1. Also, the source of the memory cell transistor MT connected to the word line WLn is connected to the drain of select transistor ST2.

Word lines WL0 to WLn connect control gate electrodes of memory cell transistors MT between NAND strings in the block. Specifically, control gate electrodes of memory cell transistors MT arrayed on the same row are connected to the same word line WL in the block. The foregoing (m+1) memory cell transistors connected to the same word line WL is handled as one page, and then, data write and data read are carried out every page.

Bit lines BL0 to BLm are connected in common to the drains of select transistors ST1 between blocks. Specifically, the same column NAND string is connected to the same bit line BL between several blocks.

FIG. 3 is a cross-sectional view showing the structure of a memory cell transistor MT. A p-type conductive substrate 20 is, for example, a p-type semiconductor substrate, a semiconductor substrate having p-well and a silicon on insulating (SIO) substrate. The memory cell transistor MT comprises a metal oxide semiconductor field effect transistor (MOSFET) including a stacked gate structure formed on the p-type semiconductor substrate 20. The p-type semiconductor substrate (p-sub) 20 is formed with two $n^+$ type diffusion regions (source/drain regions) 31 and 32, which are separated from each other. The foregoing $n^+$ type diffusion regions 31 and 32 are formed in such a manner that high-concentration $n^+$ type impurity (e.g., phosphorus [P], arsenic [As]) is implanted into the p-type semiconductor substrate 20.

A stacked gate structure is formed on the p-type semiconductor substrate 20 between $n^+$ type diffusion regions 31 and 32. Specifically, a gate insulating film 33, a charge storage layer (floating gate electrode) 34, an intergate insulating film 35 and a control gate electrode 36 are successively stacked on the p-type semiconductor substrate 20.

For example, silicon (Si) is used as the p-type semiconductor substrate 20. For example, conductive polysilicon is used as the floating gate electrode 34 and the control gate electrode 36. A silicon oxide or a silicon nitride is used as the gate insulating film 33. An ONO film (stacked film stacking silicon oxide, silicon nitride and silicon oxide), high-dielectric film such as an aluminum oxide or a stacked film of the ONO film and the high dielectric film is used as the intergate insulating film 35.

The threshold voltage of the memory cell transistor MT changes in accordance with the number of electrons injected to the floating gate electrode 34. The memory cell transistor MT stores data in accordance with the difference in the threshold voltage. The memory cell transistor MT may be configured to store binary (one-bit data), or may configured to store multi-value (two-bit or more data).

As shown in FIG. 1, the stabilization capacitor 13 comprises a depletion-type MOSFET. A transistor forming the stabilization capacitor is formed of the same material as a member forming the memory cell transistor MT and having the same thickness as above. In other words, according to this embodiment, a transistor formed via the same process as the memory cell transistor MT is used as the stabilization capacitor 13.

Specifically, a p-type semiconductor substrate 20 is formed with two n$^+$ type diffusion regions (source/drain regions) 21 and 22, which are separated from each other. An n-type channel region (n channel) 23 is formed in the p-type semiconductor substrate 20 between n$^+$ type diffusion regions 21 and 22. The foregoing channel region 23 is formed in such a manner that high-concentration n$^+$ type impurity is implanted into the p-type semiconductor substrate 20.

A stacked gate structure is formed on the channel region 23. Specifically, a first insulating film 24, a first electrode 25, a second insulating film 26 and a second electrode 27 are successively formed on the channel region 23. One terminal of the first electrode 25 is provided with a terminal 29, which is used for applying a voltage to the first electrode 25 via a contact 28. The terminal 29 has the same film thickness as the second electrode 27 and is formed of the same material as above. The terminal 29 and the second electrode 27 are isolated via an insulating film.

The first insulating film 24 has the same film thickness as the gate insulating film 33 and is formed of the same material as above. The foregoing first and second electrodes 25 and 27 have the same film thickness as the floating gate electrode and the control gate electrode 36 and are formed of the same material as above, respectively.

In the following description, a silicon oxide is used as the first insulating film 24 and the gate insulating film 33. In this case, each breakdown voltage Vw1 of the first insulating film 24 and the gate insulating film 33 is set to about 5 V. Further, an ONO film is used as the second insulating film 26 and the intergate insulating film 35. In this case, each breakdown voltage Vw2 of the second insulating film 26 and the intergate insulating film 35 is set to about 7 V.

A voltage required for the NAND flash memory 12 is set to about 12 V. Thus, the boost circuit 11 generates voltage VOUT1 of about 12 V to output voltage VOUT1 (12 V) from output terminal T1. VOUT1 (12 V) is applied to the NAND flash memory 12 and the second electrode 27 of the stabilization capacitor 1. The boost circuit 11 further generates voltage VOUT2 in addition to voltage VOUT1 to output voltage VOUT2 from output terminal T2. In this case, VOUT2 is lower than VOUT1 and higher than power supply voltage VDD. VOUT2 is set to about 5 V. Voltage VOUT2 (5 V) is applied to the terminal 29 connected to the first electrode 25 of the stabilization capacitor 13. Ground voltage VSS (0 V) is applied to the diffusion regions 21 and 22 of the stabilization capacitor 13.

Figure 4:
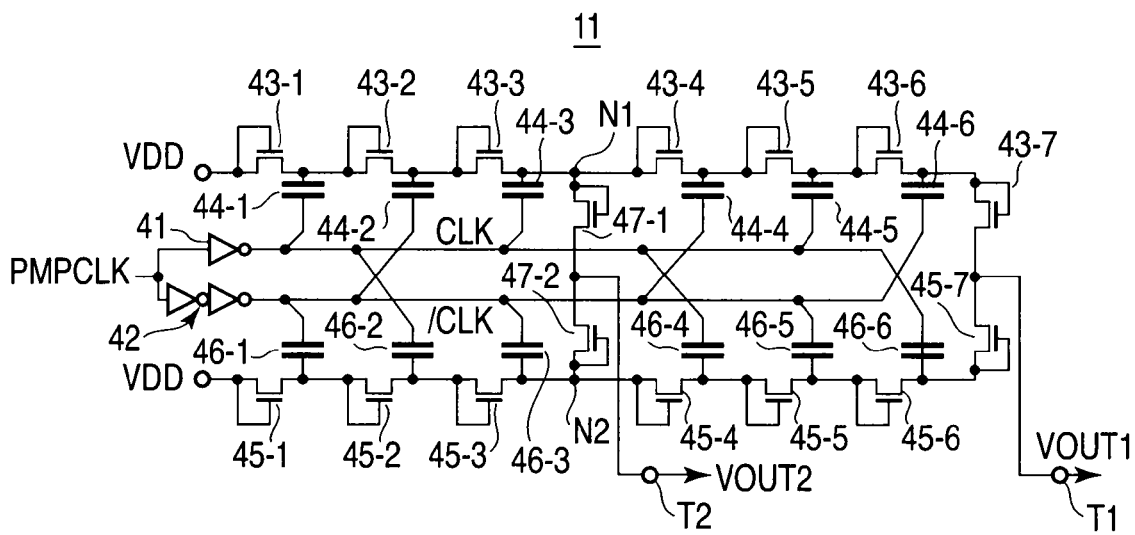
FIG. 4 is a circuit diagram showing the configuration of a charge-pump boost circuit 11.

The configuration of the boost circuit 11 is not specially limited; however, according to this embodiment, a charge-pump boost circuit is given as one example. FIG. 4 is a circuit diagram showing the configuration of a charge-pump boost circuit 11.

The boost circuit 11 is supplied with clock PMPCLK. The following configuration may be employed. Specifically, PMPCLK may be supplied from the outside of a semiconductor integrated circuit 10. Moreover, the semiconductor integrated circuit 10 includes a clock generation circuit, and the clock generation circuit generates clock signal PMPCLK.

Clock signal PMPCLK is input to an input terminal of an inverter 41. The inverter 41 outputs clock signal CLK by inverting clock signal PMPCLK. Clock signal PMPCLK is further input to an input terminal of a buffer 42 comprising two serial-connected inverters. The buffer 42 outputs clock signal /CLK opposite in phase to clock signal CLK.

The boost circuit 11 includes a plurality of capacitors (e.g. six capacitors 44-1 to 44-6 in this embodiment) and seven N-channel MOS transistors 43-1 to 43-7 functioning as diodes. The foregoing capacitors and transistors form a charge pump. Each of NMOS transistors 43-1 to 43-7 is diode-connected (i.e., gate and drain are connected), and these transistors are connected in series. The drain (anode of diode 43-1) of NMOS transistor 43-1 is supplied with power supply voltage VDD. The source (cathode of diode 43-7) of NMOS transistor 43-7 is connected to output terminal T1.

Each source of NMOS transistors 43-1 to 43-6 is connected with one electrode of each of capacitors 44-1 to 44-6. The other electrode of each of capacitors 44-1 to 44-6 is alternately supplied with the clock signal CLK and the clock signal /CLK.

A lower-stage charge pump has the complementary relationship with the upper-stage charge pump. The lower-stage charge pump is composed of diode-connected N-channel MOS transistors 45-1 to 45-7 and capacitors 46-1 to 46-6.

When the boost circuit 11 is supplied with clock signal PMPCLK, voltage boost capacitors 44-1 to 44-6 repeat charge and discharge so that a charge is successively transferred to capacitors 44-1 to 44-6. The same operation as above is carried out in the lower-stage charge pump. In this way, the boost circuit 11 can output voltage VOUT1 higher than power supply voltage VDD.

According to this embodiment, the boost circuit 11 employs the following configuration in order to fetch voltage VOUT2 lower than voltage VOUT1. Specifically, node N1 (source of NMOS transistor 43-3, in this embodiment) on the way of serial-connected NMOS transistors 43-1 to 43-7 is connected with the drain of diode-connected NMOS transistor 47-1. The source of NMOS transistor 47-1 is connected to output terminal T2. Likewise, in the lower-stage charge pump, node N2 (source of NMOS transistor 45-3, in this embodiment) on the way of serial-connected NMOS transistors 45-1 to 45-7 is connected with the drain of diode-connected NMOS transistor 47-2. The source of NMOS transistor 47-2 is connected to output terminal T2.

The boost circuit 11 having the foregoing configuration can output voltage VOUT 2 lower than voltage VOUT1, in addition to voltage VOUT1 required for the NAND flash memory 12. Voltage VOUT2 is optionally changeable by changing the position of the node connecting transistors 47-1 and 47-2.

In the semiconductor integrated circuit 10 having the foregoing configuration, voltage V2 between the second electrode 27 and the first electrode 25 is set to 7 V, which is the same as breakdown voltage Vw2 of the second insulating film 26. Moreover, voltage V1 between the first electrode 25 and the channel region 23 is set to 5 V, which is the same as breakdown voltage Vw1 of the first insulating film 24. Therefore, voltage VOUT1 (12 V) higher than breakdown voltages Vw1 and Vw2 is applied to the stabilization capacitor 13 without destroying the first and second insulating films 24 and 26. The stabilization capacitor 13 can hold a charge corresponding to voltage VOUT1.

According to this embodiment, voltage VOUT1 applied to the stabilization capacitor 13 is expressed by the following equation:

$$VOUT1 = Vw1 + Vw2$$

Figure 5:
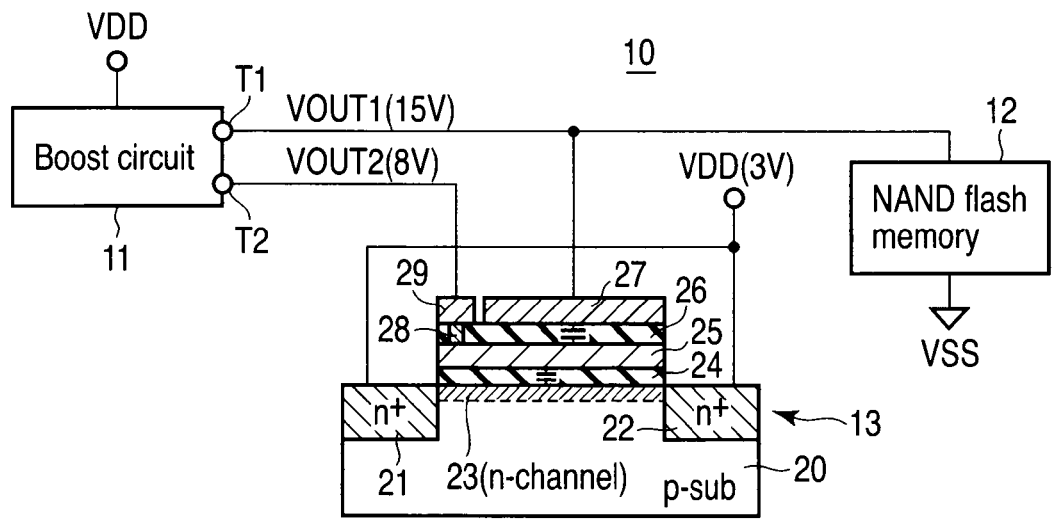
FIG. 5 is a view showing another configuration of a semiconductor integrated circuit 10 according to a first embodiment.

The following is an explanation about the configuration of a semiconductor integrated circuit 10 in the case where a voltage required for a NAND flash memory 12 is 15 V, and voltage VOUT1 applied to a stabilization capacitor 13 is 15 V. FIG. 5 is a view showing another configuration of the semiconductor integrated circuit 10 according to the first embodiment. Breakdown voltage Vw1 of the first insulating film 24 and breakdown voltage Vw2 of the second insulating film 26 are 5 and 7 V, described in FIG. 1, respectively.

A boost circuit 11 generates voltage VOUT1 of 15 V and voltage VOUT2 of 8 V. Voltage VOUT1 (15 V) is applied to a NAND flash memory 12 and a second electrode 27 of a stabilization capacitor 13. Voltage VOUT2 (8 V) is applied to a terminal 29 connected to a first electrode 25 of the stabilization capacitor 13. Power supply voltage VDD (3 V) is applied to diffusion regions 21 and 22 of the stabilization capacitor 13.

In the semiconductor integrated circuit 10, voltage V2 between the second and first electrodes 27 and 25 is set to 7 V, which is the same as breakdown voltage Vw2 of a second insulating film 26. Voltage V1 between the first electrode 25 and a channel region 23 is set to 5 V, which is the same as breakdown voltage Vw1 of a first insulating film 24. Therefore, voltage VOUT1 (15 V) higher than breakdown voltages Vw1 and Vw2 can be applied to the stabilization capacitor 13.

According to this configuration, voltage VOUT1 applied to the stabilization capacitor 13 is expressed by the following equation:

$$VOUT1 = Vw1 + Vw2 + VDD$$

As described in detail, according to this embodiment, even if the voltage required for a load circuit 12 is a high voltage, a transistor formed using a thin insulating film, as with the memory cell transistor MT, is usable as the stabilization capacitor. Therefore, the capacitance per unit area can be made large compared with a MOS transistor formed using a thick gate insulating film. In this way, the size of the stabilization capacitor 13 is made small; as a result, the area of the semiconductor integrated circuit 10 is made small. In addition, the voltage higher than the breakdown voltages is applied to the stabilization capacitor 13 without destroying the first and second insulating films 24 and 26.

A transistor including two gate electrodes is used as a stabilization capacitor, and thereby, this is the same as the configuration in which two capacitors are connected in parallel. Therefore, this serves to make large the capacitance per unit area compared with a MOS transistor formed using one thick gate insulating film. In this way, the size of the stabilization capacitor 13 is made small; as a result, the area of the semiconductor integrated circuit 10 is made small. Conversely, even if the capacitance of the stabilization capacitor 13 has been made large, it is possible to prevent the area of the semiconductor integrated circuit 10 from increasing.

Further, according to this embodiment, one boost circuit 11 outputs two voltages higher than power supply voltage VDD. Therefore, there is no need to newly provide another boost circuit 11. As a result, even if this embodiment is realized, it is possible to prevent the area of the semiconductor integrated circuit 10 from increasing.

Second Embodiment

The second embodiment relates to a stabilization capacitor 13 configured to change the position of an electrode or diffusion region to which an output voltage of a boost circuit 11 and the power supply voltage are applied.

Figure 6:
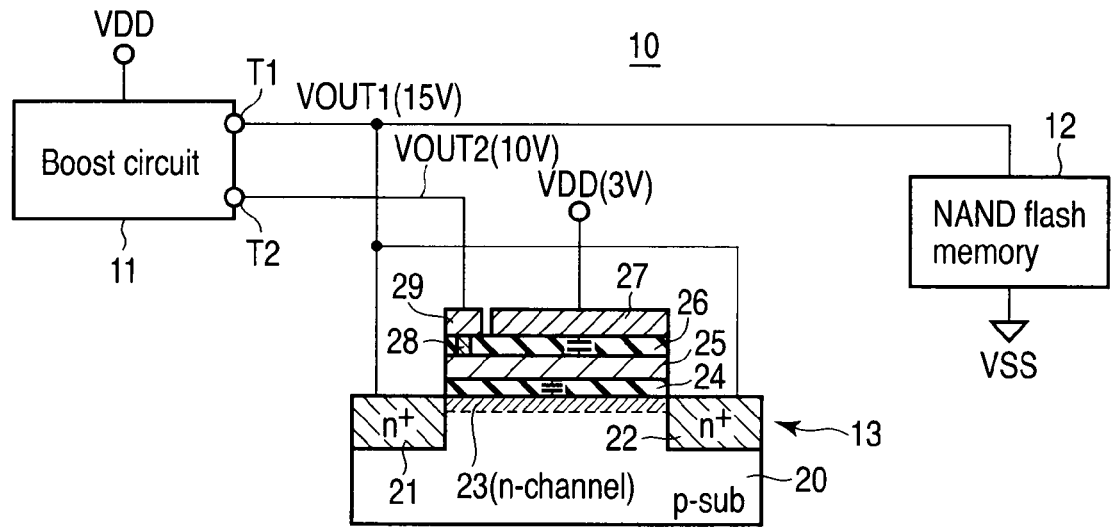
FIG. 6 is a view showing the configuration of a semiconductor integrated circuit 10 according to a second embodiment of the present invention.

FIG. 6 is a view showing the configuration of a semiconductor integrated circuit 10 according to a second embodiment of the present invention. The configuration of the stabilization capacitor 13 is the same as the first embodiment. According to this embodiment, breakdown voltage Vw1 of a first insulating film 24 and breakdown voltage Vw2 of a second insulating film 26 are set to 5 and 7 V, respectively, as in the first embodiment.

A voltage required for a NAND flash memory 12 is set to about 15 V. Thus, the boost circuit 11 generates voltage VOUT1 of about 15V to output voltage VOUT1 (15 V) from output terminal T1. Voltage VOUT1 (15 V) is applied to the NAND flash memory 12 and diffusion regions 21 and 22 of the stabilization capacitor 13. Further, the boost circuit 11 generates voltage VOUT2 lower than voltage VOUT1 in addition to voltage VOUT1 to output voltage VOUT2 from output terminal T2. VOUT2 is set to about 10 V. VOUT2 (10 V) is applied to a terminal 29 connected to a first electrode 25 of the stabilization capacitor 13. Power supply voltage VDD (3 V) is applied to a second electrode 27 of the stabilization capacitor 13.

In the semiconductor integrated circuit 10 having the foregoing configuration, voltage V2 between the second and first electrodes 27 and 25 is set to 7 V, which is the same as breakdown voltage Vw2 of the second insulating film 26. Voltage V1 between the first electrode 25 and a channel region 23 is set to 5 V, which is the same as breakdown voltage Vw1 of a first insulating film 24. Therefore, voltage VOUT1 (15 V) higher than breakdown voltages Vw1 and Vw2 can be applied to the stabilization capacitor 13 without destroying the first and second insulating films 24 and 26. The stabilization capacitor 13 can hold a charge corresponding to voltage VOUT1.

According to this configuration, voltage VOUT1 applied to the stabilization capacitor 13 is expressed by the following equation:

$$VOUT1 = Vw1 + Vw2 + VDD$$

Figure 7:
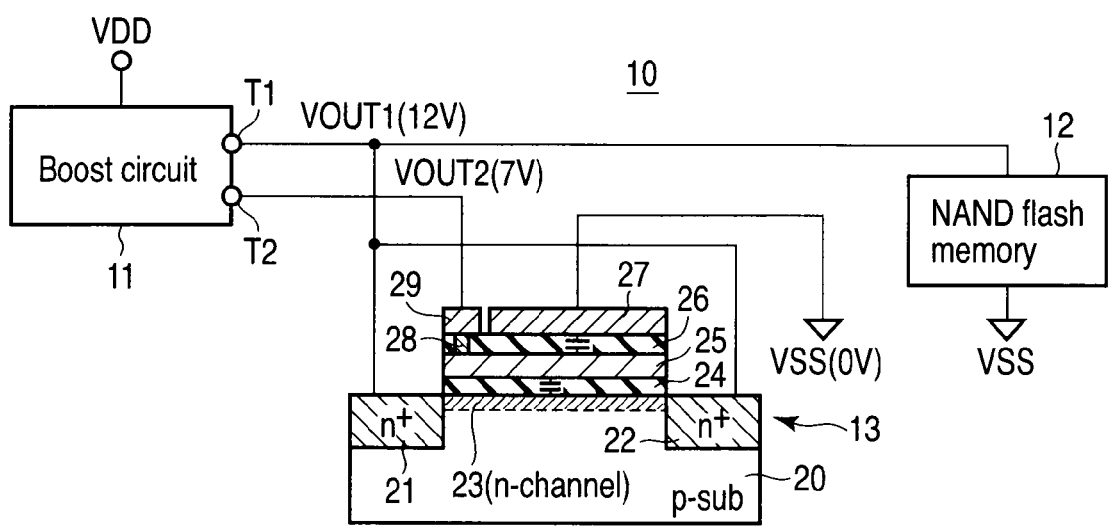
FIG. 7 is a view showing another configuration of a semiconductor integrated circuit 10 according to a second embodiment.

The following is an explanation of the configuration of a semiconductor integrated circuit 10 in the case where a voltage required for a NAND flash memory 12 is 12 V, and voltage VOUT1 applied to a stabilization capacitor 13 is 12 V. FIG. 7 is a view showing another configuration of the semiconductor integrated circuit 10 according to the second embodiment. Breakdown voltage Vw1 of the first insulating film 24 and breakdown voltage Vw2 of the second insulating film 26 are 5 and 7 V, described in FIG. 1, respectively, as in the configuration described in FIG. 6.

A boost circuit 11 generates voltage VOUT1 of 12 V and voltage VOUT2 of 7 V. Voltage VOUT1 (12 V) is applied to a NAND flash memory 12 and diffusion regions 21 and 22 of a stabilization capacitor 13. Voltage VOUT2 (7 V) is applied to a terminal 29 connected to a first electrode 25 of the stabilization capacitor 13. Ground voltage VSS (0 V) is applied to a second electrode 27 of the stabilization capacitor 13.

In the semiconductor integrated circuit 10 having the foregoing configuration, voltage V2 between the second electrode 27 and the first electrode 25 is set to 7 V, which is the same as breakdown voltage Vw2 of the second insulating film 26. Moreover, voltage V1 between the first electrode 25 and the channel region 23 is set to 5 V, which is the same as breakdown voltage Vw1 of the first insulating film 24. Therefore, voltage VOUT1 (12 V) higher than breakdown voltages Vw1 and Vw2 is applied to the stabilization capacitor 13 without destroying the first and second insulating films 24 and 26.

According to this embodiment, voltage VOUT1 applied to the stabilization capacitor 13 is expressed by the following equation:

$$VOUT1 = Vw1 + Vw2$$

As described in detail, according to this embodiment, even if the voltage required for a load circuit 12 is a high voltage, a transistor formed using a thin insulating film, as with the memory cell transistor MT, is usable as the stabilization capacitor. In addition, the voltage higher than these breakdown voltages can be applied to the stabilization capacitor 13 without destroying the first and second insulating films 24 and 26. Other effects are the same as in the first embodiment.

Third Embodiment

The third embodiment relates to another configuration of a stabilization capacitor 13. Specifically, the stabilization capacitor 13 is configured in such a manner that a stacked gate structure is formed on an n-well.

FIG. 8 is a view showing the configuration of a semiconductor integrated circuit 10 according to a third embodiment of the present invention. A p-type semiconductor substrate 20 is provided with an n-type semiconductor region (n-well) 20A. The n-well 20A is formed in such a manner that low-concentration n-type impurity is implanted into the p-type semiconductor substrate 20. The n-well 20A is formed with two n+ diffusion regions (source/drain regions) 21 and 22, which are isolated from each other.

A stacked gate structure is formed on the n-well 20A between two diffusion regions 21 and 22. The stacked gate structure is formed in such a manner that a first insulating film 24, a first electrode 25, a second insulating film 26 and a second electrode 27 are successively stacked, like the first embodiment. In this way, the stabilization capacitor 13 is configured.

A voltage required for a NAND flash memory 12 is set to about 12 V. Therefore, a boost circuit 11 generates voltage VOUT1 of about 12 V to output voltage VOUT1 from output terminal T1. Voltage VOUT1 (12 V) is applied to the NAND flash memory 12 and the second electrode 27 of the stabilization capacitor 13. Further, the boost circuit 11 generates voltage VOUT2 lower than voltage VOUT1 in addition to voltage VOUT1 to output voltage VOUT2 from output terminal T2. VOUT2 is set to about 5 V. VOUT2 (5 V) is applied to a terminal 29 connected to a first electrode 25 of the stabilization capacitor 13. Power supply voltage VDD (3 V) is applied to diffusion regions 21 and 22 of the stabilization capacitor 13.

Even if the semiconductor integrated circuit 10 has the foregoing configuration, the same operation as the configuration shown in FIG. 1 is possible, and the same effect as the configuration shown in FIG. 1 is obtained. The stabilization capacitor shown in this embodiment is applicable to the semiconductor integrated circuits 10 shown in FIGS. 5 to 7. Also in this case, the same operation as the configurations of FIGS. 5 to 7 is possible using the stabilization capacitor 13 of this embodiment.

Fourth Embodiment

The fourth embodiment relates to another configuration of a boost circuit. Specifically, voltage VOUT1 is generated using the boost circuit, and then, voltage VOUT2 lower than voltage VOUT1 is generated by dividing voltage VOUT1 using a resistance element.

FIG. 9 is a view showing the configuration of a semiconductor integrated circuit 10 according to a fourth embodiment of the present invention. A boost circuit 11 boosts power supply voltage VDD to generate output voltage VOUT1 higher than power supply voltage VDD. Output voltage VOUT1 is output from output terminal T1 of the boost circuit 11. The configuration of the circuit 11 is the same as FIG. 4.

Two serial-connected resistance elements 11A and 11B are connected between terminal T1 of the boost circuit 11 and ground terminal VSS. A connection node of these resistance elements 11A and 11B is connected to a terminal 29. In other words, voltage VOUT1 is divided by the resistance elements 11A and 11B, and then, divided voltage VOUT2 is applied to the terminal 29. Voltage VOUT2 is optionally settable using the resistance elements 11A and 11B. According to this embodiment, voltage VOUT2 is set to 5 V.

Even if the semiconductor integrated circuit 10 has the foregoing configuration, the same operation as the configuration shown in FIG. 1 is possible, and the same effect as the configuration shown in FIG. 1 is obtained. The boost circuit shown in this embodiment is applicable to the semiconductor integrated circuits shown in FIGS. 5 to 8. Also in this case, the same operation as the stabilization capacitor of FIGS. 5 to 8 is possible using the boost circuit of this embodiment.

Fifth Embodiment

The fifth embodiment relates to another configuration of a boost circuit. Specifically, voltage VOUT1 and voltage VOUT2 are generated using an independent boost circuit.

FIG. 10 is a view showing the configuration of a semiconductor integrated circuit 10 according to a fourth embodiment of the present invention. The semiconductor integrated circuit 10 includes first and second boost circuits 11-1 and 11-2.

The first boost circuit 11-1 boosts power supply voltage VDD to generate output voltage VOUT1 higher than power supply voltage VDD. According to this embodiment, output voltage VOUT1 is set to 12 V. Voltage VOUT1 output from the first boost circuit 11-1 is applied to a NAND flash memory and a second electrode 27 of a stabilization capacitor 13.

The second boost circuit 11-2 boosts power supply voltage VDD to generate output voltage VOUT2 higher than power supply voltage VDD. According to this embodiment, output voltage VOUT2 is set to 5 V. Voltage VOUT2 output from the second boost circuit 11-2 is applied to a terminal 29 connected to a first electrode 25 of the stabilization capacitor 13.

The foregoing first and second boost circuits 11-1 and 11-2 each have the configuration of a charge pump as in FIG. 4. The number of stages of capacitors included in the first and second boost circuits 11-1 and 11-2 is controlled to obtain a desired voltage.

Even if the semiconductor integrated circuit 10 has the foregoing configuration, the same operation as the configuration shown in FIG. 1 is possible, and further, the same effect as the configuration shown in FIG. 1 is obtained. The boost circuit shown in this embodiment is applicable to the semiconductor integrated circuits 10 shown in FIGS. 5 to 8. Also in this case, the same operation as the stabilization capacitors of FIGS. 5 to 8 is possible using the boost circuit of this embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
a boost circuit configured to boost a power supply voltage so as to generate first and second voltages, the second voltage being lower than the first voltage;
a load circuit supplied with the first voltage; and
a capacitor having: first and second diffusion regions formed in a state of separating from each other in a semiconductor substrate; a first insulating film formed on a channel region between the first and second diffusion regions; a first electrode formed on the first insulating film; a second insulating film formed on the first electrode; and a second electrode formed on the second insulating film, and comprising a transistor,
the second voltage being applied to the first electrode,
the first voltage being applied to the second electrode,
the power supply voltage being applied to at least one of the first and second diffusion regions.

2. The circuit according to claim 1, wherein the first voltage is higher than each breakdown voltage of the first and second insulating films.

3. The circuit according to claim 1, wherein
the load circuit includes an electrically rewritable memory cell,
the memory cell has:
third and fourth diffusion regions formed in a state of separating from each other in the semiconductor substrate;
a gate insulating film formed on the semiconductor substrate between the third and fourth diffusion regions;
a floating gate electrode formed on the gate insulating film;
an intergate insulating film formed on the floating gate electrode; and
a control gate electrode formed on the intergate insulating film,
the first insulating film has the same breakdown voltage as the gate insulating film, and
the second insulating film has the same breakdown voltage as the intergate insulating film.

4. The circuit according to claim 1, wherein
the boost circuit comprises a charge pump, and includes a plurality of units each composed of a diode-connected transistor and a capacitor,
the first voltage is output from the final unit, and
the second voltage is output from a unit prior to the final unit.

5. The circuit according to claim 1, wherein the boost circuit includes:
a first boost circuit configured to boost the power supply voltage so as to generate the first voltage; and
a second boost circuit configured to boost the power supply voltage so as to generate the second voltage.

6. A semiconductor integrated circuit comprising:
a boost circuit configured to boost a power supply voltage so as to generate first and second voltages, the second voltage being lower than the first voltage;
a load circuit supplied with the first voltage; and
a capacitor having: first and second diffusion regions formed in a state of separating from each other in a semiconductor region; a first insulating film formed on a channel region between the first and second diffusion regions; a first electrode formed on the first insulating film; a second insulating film formed on the first electrode; and a second electrode formed on the second insulating film, and comprising a transistor, the semiconductor region, the first and second diffusion regions being the same conductivity type,
the second voltage being applied to the first electrode,
the first voltage being applied to the second electrode,
the power supply voltage being applied to at least one of the first and second diffusion regions.

7. The circuit according to claim 6, wherein the first voltage is higher than each breakdown voltage of the first and second insulating films.

8. The circuit according to claim 6, wherein
the load circuit includes an electrically rewritable memory cell,
the memory cell has:
third and fourth diffusion regions formed in a state of separating from each other in a semiconductor substrate;
a gate insulating film formed on the semiconductor substrate between the third and fourth diffusion regions;
a floating gate electrode formed on the gate insulating film;
an intergate insulating film formed on the floating gate electrode; and
a control gate electrode formed on the intergate insulating film,
the first insulating film has the same breakdown voltage as the gate insulating film, and
the second insulating film has the same breakdown voltage as the intergate insulating film.

9. The circuit according to claim 6, wherein
the boost circuit comprises a charge pump, and includes a plurality of units each composed of a diode-connected transistor and a capacitor,
the first voltage is output from the final unit, and
the second voltage is output from a unit prior to the final unit.

10. The circuit according to claim 6, wherein the boost circuit includes:
a first boost circuit configured to boost the power supply voltage so as to generate the first voltage; and
a second boost circuit configured to boost the power supply voltage so as to generate the second voltage.

* * * * *